Figure 1:
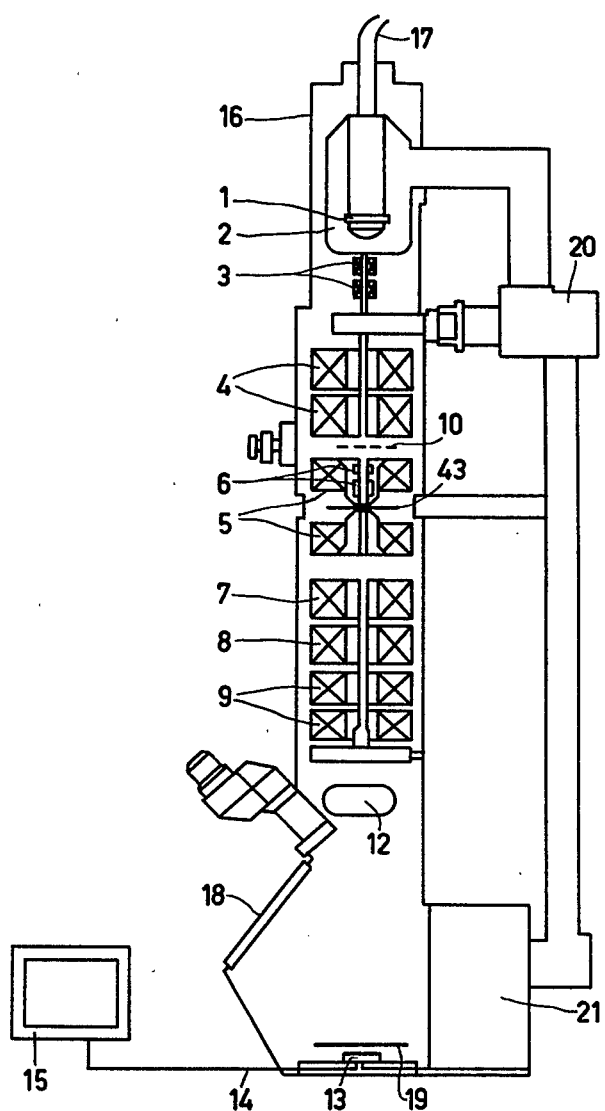

United States Patent [19]

Jore et al.

[11] 4,352,015

[45] Sep. 28, 1982

[54] ANTI-CONTAMINATION DIAPHRAGM FOR AN ELECTRON BEAM APPARATUS

[75] Inventors: Alfred Jore; Gerardus G. P. Van Gorkom; Nicolaas H. Dekkers, all of Eindhoven, Netherlands

[73] Assignee: U.S. Philips Corporation, New York, N.Y.

[21] Appl. No.: 180,712

[22] Filed: Aug. 25, 1980

[30] Foreign Application Priority Data

Sep. 5, 1979 [NL] Netherlands ............... 7906633

[51] Int. Cl.³ ............................................. G01N 23/00
[52] U.S. Cl. .................................. 250/311; 250/503.1; 250/505.1
[58] Field of Search ............... 250/311, 396, 398, 443, 250/503, 505, 514, 440; 313/360

[56] References Cited

U.S. PATENT DOCUMENTS 3,124,680  3/1964  Van Dorsten ............... 250/443
3,328,618  6/1967  Wilson ............... 313/360

FOREIGN PATENT DOCUMENTS 2000901  1/1979  United Kingdom ............... 250/311

Primary Examiner—Bruce C. Anderson
Attorney, Agent, or Firm—Paul R. Miller

[57] ABSTRACT

In order to reduce object contamination during the examination or machining of the object in an electron beam apparatus, an anti-contamination diaphragm is provided in place of the customary diaphragm. The anti-contamination diaphragm has a central aperture which corresponds to a customary diaphragm aperture, and a concentric annular aperture for transmitting a non-paraxial hollow beam which irradiates a ring around the paraxial focus on the object. The conical hollow anti-contamination beam forms a barrier against contaminating residual gas molecules, notably hydrocarbon molecules.

8 Claims, 3 Drawing Figures

ANTI-CONTAMINATION DIAPHRAGM FOR AN ELECTRON BEAM APPARATUS

The invention relates to an electron beam apparatus, comprising an electron source for generating an electron beam, an electron-optical lens system which is arranged along an electron-optical axis, and anti-contamination means for reducing object contamination.

An electron beam apparatus of this kind is known from U.S. Pat. No. 3,124,680 in the form of an electron microscope. The anti-contamination means therein are formed by two plates which are cooled and which surround the object. In practical arrangements, notably in the case of high resolution STEM mode measurements, it has been found that object contamination is often still so severe that the object can be irradiated by the electron beam only for a brief period of time without changes occurring due to contamination of the object. Similar problems are encountered in high resolution electron beam machining apparatus, for example, for the manufacture of microcircuits.

The invention has for its object to mitigate these drawbacks; to achieve this, an electron beam apparatus of the described kind is characterized in that the anti-contamination means include a composite diaphragm which is arranged about the electron-optical axis so that, when a paraxial part of the electron beam transmitted by the diaphragm is focused onto a target spot in an object plate, a non-paraxial part of the electron beam transmitted by the diaphragm is also incident in the object plane in an annular zone surrounding the paraxial target spot.

Because an annular zone surrounding a central object part to be examined or machined, is irradiated by means of a hollow beam in an electron beam apparatus in accordance with the invention, contamination of a central object part situated therewithin is substantially reduced. The hollow beam forms a barrier against hydrocarbon molecules which would otherwise travel towards the central part and which are mainly responsible for object contamination. The diameter and the width of the irradiated ring can be optimized by the geometry and positioning of the anti-contamination diaphragm and are preferably chosen so that the ring closely encircles an object zone to be scanned or machined.

In a preferred embodiment, the anti-contamination diphragm consists of a composite, annular diaphragm having a central aperture for transmitting a paraxial beam forming object information and a concentric annular aperture for transmitting a non-paraxial cone-like anti-contamination beam. The anti-contamination diaphragm is preferably arranged in the place where normally a diaphragm is arranged which determines the angle of aperture of the electron beam. This function is performed by the central aperture of the anti-contamination diaphragm. For the formation of the anti-contamination beam, use is made of the spherical aberration of the condenser lens system, which is always present. If so desired for reasons of geometry or for electron-optical reasons, the diaphragm may be constructed so that the central aperture and the annular aperture are not situated in the same plane.

Some preferred embodiments in accordance with the invention will be described in detail hereinafter with reference to the accompanying diagrammatic drawing.

Figure 2:
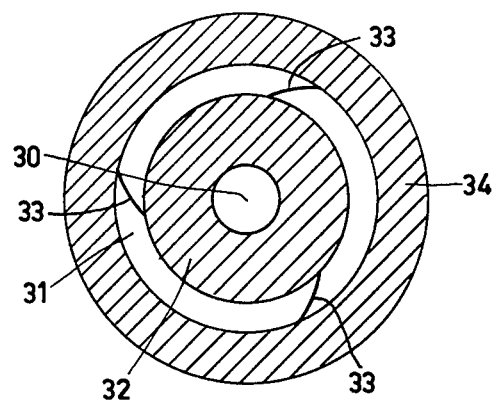
Figure 3:
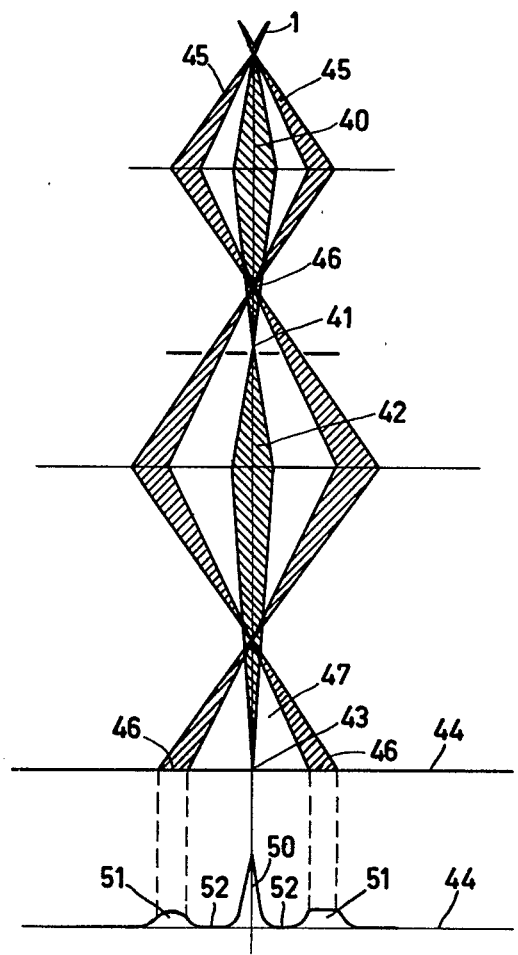

FIG. 1 is a sectional view of an electron microscope comprising an anti-contamination diaphragm in the condenser lens system, FIG. 2 is a front view of an anti-contamination diaphragm, and FIG. 3 illustrates the beam path in a relevant part of the electron beam apparatus in accordance with the invention, together with the current density of the electron beam at the object surface.

An electron microscope as shown in FIG. 1 comprises an electron source 1 with an anode 2, a beam alignment system 3, a condenser system 4, an objective lens 5, a beam scanning system 6, a diffraction lens 7, an intermediate lens 8, a projection lens 9, and a diaphragm 10. The electron microscope may furthermore comprise a film camera 12 and an electron detector 13 which is connected via a signal output line 14, to a television monitor 15. All electron-optical elements are accommodated in a column 16 which in this case includes an electrical input supply line 17 for the electron source, a viewing window 18, an optical viewer 20 for observing an image formed on a fluorescent screen 19, and a vacuum pumping device 21.

The diaphragm 10 in accordance with the invention is constructed as an anti-contamination diaphragm which is shown in a front view, i.e. viewed from the electron source, in FIG. 2 and which has a central aperture 30 and an annular aperture 31.

The two apertures are separated by a separating ring 32; this separating ring, surrounding the central aperture 30, is secured in a mounting rim 34 by means of supporting strips 33.

Suitable dimensions for an anti-contamination diaphragm which is arranged in the place of the customary diaphragm in a STEM electron microscope are, for example: a central aperture having a diameter of approximately 20 $\mu$m, an annular aperture having a radial width of approximately 75 $\mu$m, the radius of the outer boundary of the annular aperture being approximately 450 $\mu$m.

In the embodiment shown, the supporting strips 33 have a curved construction, so that thermal expansion can be better compensated and to prevent the formation of gaps in the anti-contamination hollow electron beam. However, in many cases this is not necessary and straight connecting strips can be used instead. The occurrence of gaps is provided in the conical anti-contamination diaphragm having two concentrically situated annular apertures separated by an annular member (not shown) connected respectively to the ring 32 and to the mounting rim 34, by radially staggered supporting strips. An anti-contamination diaphragm may be made of, for example, platinum and can be formed by the removal of material in the region of the transmission apertures, for example, by spark erosion or electrolysis.

If the irradiation of a surrounding annular region on an object, is undesirable for some reason, the anti-contamination filter can be temporarily replaced by a customary diaphragm arranged at the same location.

FIG. 3 shows a beam path in a relevant part of an electron beam apparatus comprising an anti-contamination diaphragm.

After a first condenser lens field, an electron beam 40 forms a cross-over 41 and after passing through subsequent lenses, a paraxial beam portion 42 which is transmitted by the central aperture of the anti-contamination diaphragm located in a transverse plane through the cross-over point 40 forms a target spot 43 in an object plane 44. Using the scanning system shown in FIG. 1, this target spot can be made to scan a pattern over the surface of an object either for object contamination, where information is recovered from the locally transmitted electrons, or for object machining, where the target spot forms a pattern of tracks in an object surface.

A non-paraxial beam portion 45 which is transmitted by the annular aperture of the anti-contamination diaphragm, is incident in the object plane 44 in an annular zone 46 around the target spot 43. As a result of the spherical aberration of the condenser lens fields, a stronger focussing effect occurs for the non-paraxial part of the generated electron beam 45, providing an earlier initial cross-over 46, and this gives rise to an earlier cross-over of the anti-contamination beam, which is situated in front of the object plane. The anti-contamination beam thus forms a hollow cone 47 over the target spot 43 of the paraxial, information-forming or object-processing beam.

FIG. 3 also shows the current density distribution of the electron current in the object plane 44. Over the target spot 43, the paraxial beam 42 forms a comparatively narrow peak 50 of high current density. The non-paraxial beam 45 forms a ring 51 having a lower current density and an intermediate zone 52 is not struck by electrons. In a scanning electron microscope, the peak 50 describes, for example, a rectangular scanning pattern over the object and the inner boundary of the ring forms a describing circle around this rectangle. In the case of electron beam machining, the ring is situated, for example, immediately around the region on the object part to be machined.

What is claimed is:

1. In an electron beam apparatus comprising an electron source for generating an electron beam, an electron-optical lens system arranged along an electron optical axis for transmitting said electron beam, and anti-contamination means for reducing object contamination, the improvement comprising said anti-contamination means including a composite diaphragm arranged about said electron optical axis, said composite diaphragm transmitting a paraxial portion of said electron beam to an object plane and forming a non-paraxial portion of said electron beam annularly surrounding said paraxial portion on said object plane, said non-paraxial portion preventing contamination of the object.

2. An electron beam apparatus according to claim 1, wherein said composite diaphragm is arranged at least approximately near a condenser lens system of said electron-optical lens system.

3. An electron beam apparatus according to one of claims 1 or 2, wherein said composite diaphragm includes an electron barrier having a central aperture for passing said paraxial portion of said electron beam and at least one concentric aperture annularly surrounding said central aperture.

4. An electron beam apparatus according to claim 3, wherein said central aperture and said concentric aperture are disposed in different planes of said composite diaphragm.

5. An electron beam apparatus according to claim 4, wherein said composite diaphragm is provided with two concentrically situated annular apertures having mutually staggered supporting strips.

6. An electron beam apparatus according to claim 3, wherein said composite diaphragm is provided with two concentrically situated annular apertures having mutually staggered supporting strips.

7. An anti-contamination diaphragm for use in an electron microscope comprising a composite diaphragm structure having a central aperture for passing a paraxial portion of an electron beam and at least one annular aperture surrounding said central aperture for passing a non-paraxial portion of said electron beam, said non-paraxial portion preventing contamination of said electron beam.

8. A method of performing at least one of examination and machining of an object in an electron beam apparatus comprising the steps of passing an electron beam from an electron source, forming said electron beam by an electron-optical lens system, and preventing the contamination of the object by a diaphragm simultaneously passing a paraxial portion of said electron beam to an object plane and forming a non-paraxial portion of said electron beam annularly around said paraxial portion at said object plane.

* * * * *